US010482975B2

(12) United States Patent
Reboulet et al.

(10) Patent No.: US 10,482,975 B2
(45) Date of Patent: Nov. 19, 2019

(54) FLASH MEMORY CELL WITH DUAL ERASE MODES FOR INCREASED CELL ENDURANCE

(71) Applicant: Microchip Technology Incorporated, Chandler, AZ (US)

(72) Inventors: Luc Reboulet, Chandler, AZ (US); James Walls, Mesa, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/008,234

(22) Filed: Jun. 14, 2018

(65) Prior Publication Data
US 2019/0287624 A1 Sep. 19, 2019

Related U.S. Application Data

(60) Provisional application No. 62/643,795, filed on Mar. 16, 2018.

(51) Int. Cl.
*G11C 16/16* (2006.01)
*G11C 16/34* (2006.01)
*G11C 16/08* (2006.01)
*G11C 16/04* (2006.01)

(52) U.S. Cl.
CPC .......... *G11C 16/16* (2013.01); *G11C 16/0458* (2013.01); *G11C 16/08* (2013.01); *G11C 16/349* (2013.01)

(58) Field of Classification Search
CPC ..... G11C 16/16; G11C 16/0458; G11C 16/08; G11C 16/349
See application file for complete search history.

(56) References Cited

U.S. PATENT DOCUMENTS

| 2009/0201744 A1* | 8/2009 | Chern ............... G11C 16/16 365/185.33 |
| 2010/0091572 A1 | 4/2010 | Choi ..................... 365/185.18 |
| 2013/0223148 A1* | 8/2013 | Seo ..................... H01L 27/04 365/185.11 |
| 2015/0236031 A1 | 8/2015 | Mantelli et al. ......... 365/185.28 |
| 2016/0247574 A1 | 8/2016 | He et al. ................. 365/185.19 |

FOREIGN PATENT DOCUMENTS

JP 11220111 A 8/1999

OTHER PUBLICATIONS

International Search Report and Written Opinion, Application No. PCT/US2019/021785, 11 pages, dated Jun. 13, 2010.

* cited by examiner

*Primary Examiner* — Tri M Hoang
(74) *Attorney, Agent, or Firm* — Slayden Grubert Beard PLLC

(57) ABSTRACT

An integrated circuit device may at least one memory cell configured for dual erase modes. Each memory cell may be configured to be erased via two different nodes, which may be selectively used (e.g., in any switched or alternating manner) to reduce the erase cycling at each individual node and thereby increase (e.g., double) the lifespan of the cell. For example, the device may include flash memory cells having a pair of program/erase nodes (e.g., an erase gate and a word line) formed over each respective floating gate, wherein the program/erase nodes are selectively used (e.g., in any switched or alternating manner) for the cell erase function.

9 Claims, 7 Drawing Sheets

| | WORDLINE VOLTAGE | COUPLING GATE VOLTAGE | BITLINE VOLTAGE | SOURCELINE VOLTAGE | BITLINE INHIBIT VOLTAGE |
|---|---|---|---|---|---|
| READ | 1.8V | 0V | 0.8V | 0V | 0V |
| PROGRAM | 1.5V | 8.5V | 0.6V | 8.5V | 2.5V |
| WL ERASE | 10V | -5V | 0V | 0V | 0V |
| EG ERASE | -5V | 10V | 0V | 0V | 0V |

VOLTAGE TRUTH TABLE

US 10,482,975 B2

FLASH MEMORY CELL WITH DUAL ERASE MODES FOR INCREASED CELL ENDURANCE

RELATED PATENT APPLICATION

This application claims priority to commonly owned U.S. Provisional Patent Application No. 62/643,795 filed Mar. 16, 2018, the entire contents of which are hereby incorporated by reference for all purposes.

TECHNICAL FIELD

The present disclosure relates to integrated circuit memory devices, and more particularly, to a flash memory cell with dual erase modes for increased endurance (lifespan) of the cell.

BACKGROUND

Integrated circuit memory cells typically have a limited useful lifespan, e.g., due to degradation of cell performance over time. For example, certain flash memory cells may wear out after repeated program/erase cycling, e.g., in the range of 100,000 to 10 million cycles. In a typical flash memory cell, the erase performance degrades faster than the program performance, as a function of program/erase cycles.

FIG. 1 shows the effects of program/erase cycling on an example flash memory cell having a pair of floating gates. In particular, FIG. 1 shows example measured erase current data (Ir1) as a function of program/erase cycles and measured program current data (Ir0) as a function of program/erase cycles. As shown, the erase current (Ir1) degrades faster than the program current (Ir0), as a function of program/erase cycles. Thus, the effective lifespan of such memory cell may be limited by the erase cycling of the cell.

SUMMARY

Embodiments of the present invention provide an integrated circuit device including at least one memory cell configured for dual erase modes. For example, each memory cell may be configured to be erased via two different nodes, which may be selectively used (e.g., in any switched or alternating manner) to reduce the erase cycling at each individual node and thereby increase (e.g., double) the effective lifespan of the cell. Some embodiments provide an integrated circuit device including flash memory cells having a pair of program/erase nodes (e.g., an erase gate and a word line) formed over each floating gate, wherein the program/erase nodes are selectively used (e.g., in any switched or alternating manner) for the cell erase function.

Some embodiments provide a method including providing a memory cell, e.g., a flash memory cell, including a floating gate and a pair of program/erase nodes over the floating gate, and using control electronics to selectively switch between the pair of program/erase nodes to perform a series of erase functions in the memory cell. In some embodiments, the pair of program/erase nodes comprise an erase gate and a word line, or a coupling gate and a word line, for example.

In one embodiment, the control electronics may switch or alternate between the pair of program/erase nodes to perform erase functions in the memory cell. For example, the control electronics may switch back and forth between the pair of program/erase nodes after each erase function. As another example, the control electronics may switch between the pair of program/erase nodes after every N erase functions, wherein N is greater than 1, e.g., where N is at least 10, at least 100, at least 1,000, at least 10,000, or at least 1,000,000.

In one embodiment, the method may include maintaining a count of erase functions performed using each of the pair of program/erase nodes, and switching between the program/erase nodes for performing erase functions based at least on the count of erase functions performed using each of the pair of program/erase nodes.

In one embodiment, the method may include measuring an erase current of the memory cell, and switching between the program/erase nodes for performing erase functions based at least on the measured erase current.

Some embodiments provide an electronic device, including a memory cell, e.g., flash memory cell, including a floating gate and a pair of program/erase nodes over the floating gate, and erase control electronics configured to selectively alternate or switch between the pair of program/erase nodes to perform a series of erase functions in the memory cell, e.g., after each erase function, or after N erase functions, wherein N is at least 10, at least 100, at least 1,000, at least 10,000, or at least 1,000,000.

BRIEF DESCRIPTION OF THE DRAWINGS

Example aspects of the present disclosure are described below in conjunction with the figures, in which.

DESCRIPTION OF THE INVENTION

Embodiments of the present invention provide an integrated circuit device including at least one memory cell configured for dual erase modes. For example, each memory cell may be configured to be erased via two different nodes, which may be selectively used (e.g., in any switched or alternating manner) to reduce the erase cycling at each individual node and thereby increase (e.g., double) the lifespan of the cell. Some embodiments provide an integrated circuit device including flash memory cells having a pair of program/erase nodes (e.g., an erase gate and a word line) formed over a floating gate, wherein the program/erase nodes are selectively used (e.g., in any switched or alternating manner) for the cell erase function.

As used herein, a "program/erase" node may include any memory cell node or element coupled to a floating gate for program and/or erase functions. Example program/erase nodes include an erase gate, a program gate, a word line, and a "coupling gates" (e.g., a program or erase gate coupled to multiple floating gates, such as the erase gate/coupling gate EG/CG formed between and coupled to a pair of floating gates FG in the example flash memory cell shown in FIG. 2).

Some embodiments provide an integrated circuit device including an array of flash memory cells, where each memory cell includes a pair of floating gates, with an erase gate or coupling gate shared by the floating gates, and a separate word line formed over each floating gate. The integrated circuit device may utilize the erase gate/coupling gate and the word line over each floating gate selectively (e.g., in any switched or alternating manner) for the erase function. This may increase the lifespan of such memory cells, e.g., by 100%, as compared with conventional devices. In one example embodiment, the memory cells may comprise "SuperFlash" cells, e.g., "ESF1+" or "ESF1 EG" cells or variants thereof, from Microchip Technology Inc. having a headquarters at 2355 West Chandler Blvd.

Figure 1:
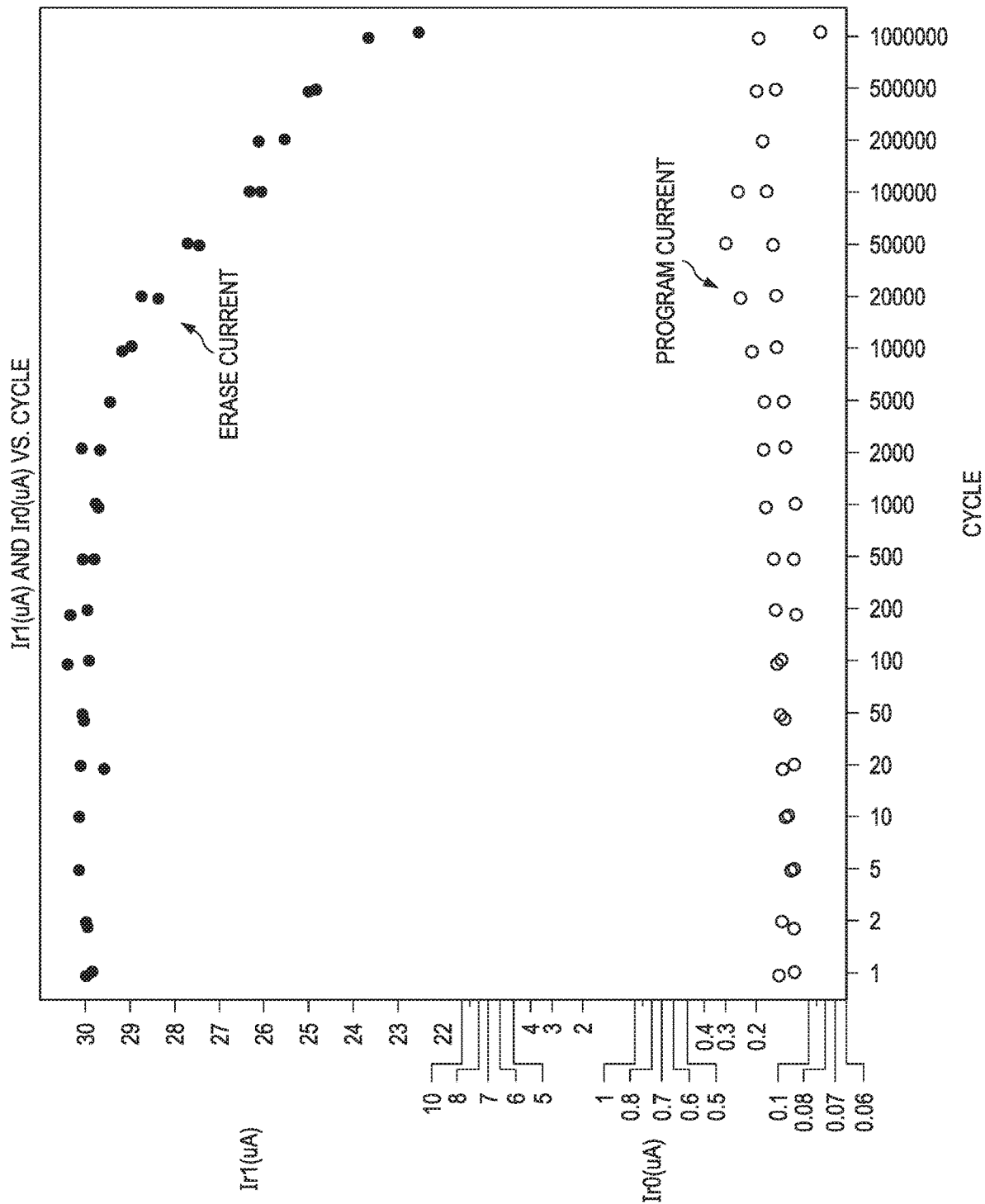
FIG. 1 is a graph showing the effects of program/erase cycling on an example conventional flash memory cell having a pair of floating gates.
Figure 2:
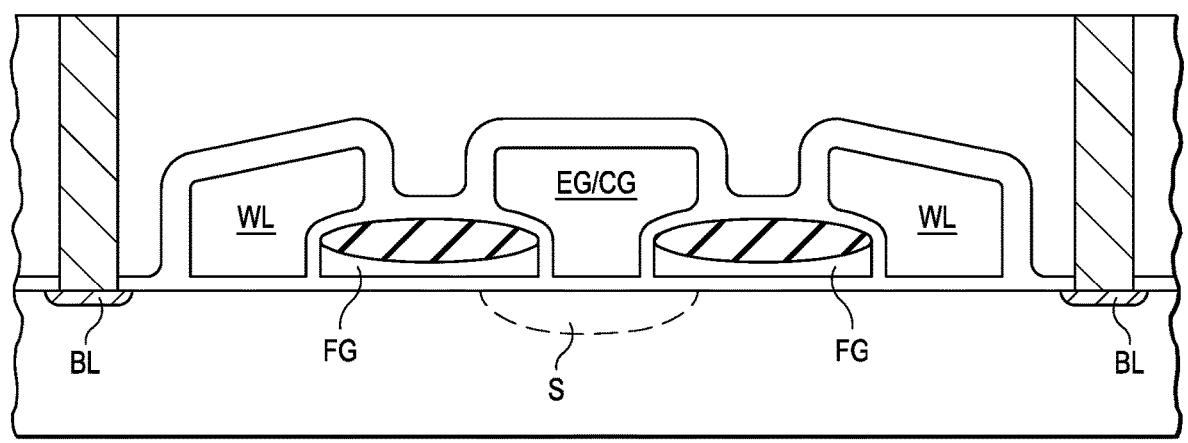
FIG. 2 is a cross-sectional view of an example known flash memory cell including a pair of floating gates, a word line formed over each floating gate, and an erase gate or "coupling gate" extending over both floating gates.

FIG. 2 shows an example flash memory cell 10 that includes a pair of floating gates (FG), a word line (WL) formed over each floating gate, and an erase gate, also referred to as a "coupling gate" (EG/CG) extending over both floating gates (FGs). FIG. 2 also shows a pair of bit lines (BL) at opposing sides of the cell.

Figure 3A:
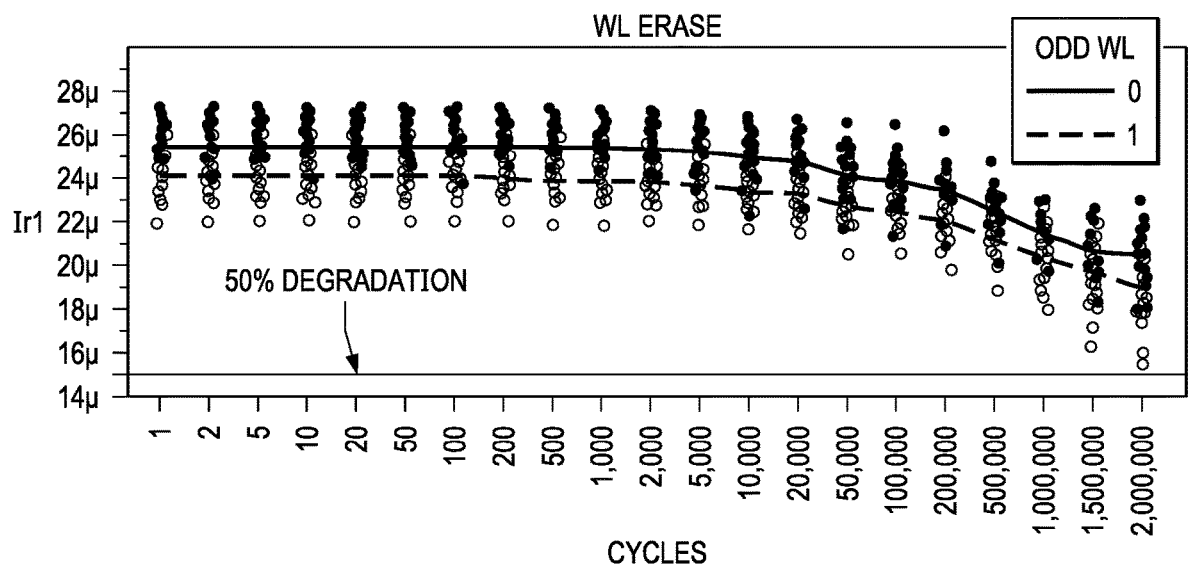
FIGS. 3A-3D are graphs showing example erase current (Ir1) data and program current (Ir0) data for a memory cell including a word line and an erase gate/coupling gate over a floating gate, illustrating that performing erase functions through either the word line or the erase gate/coupling gate surprisingly provides a similar degradation of erase performance over time.
Figure 3B:
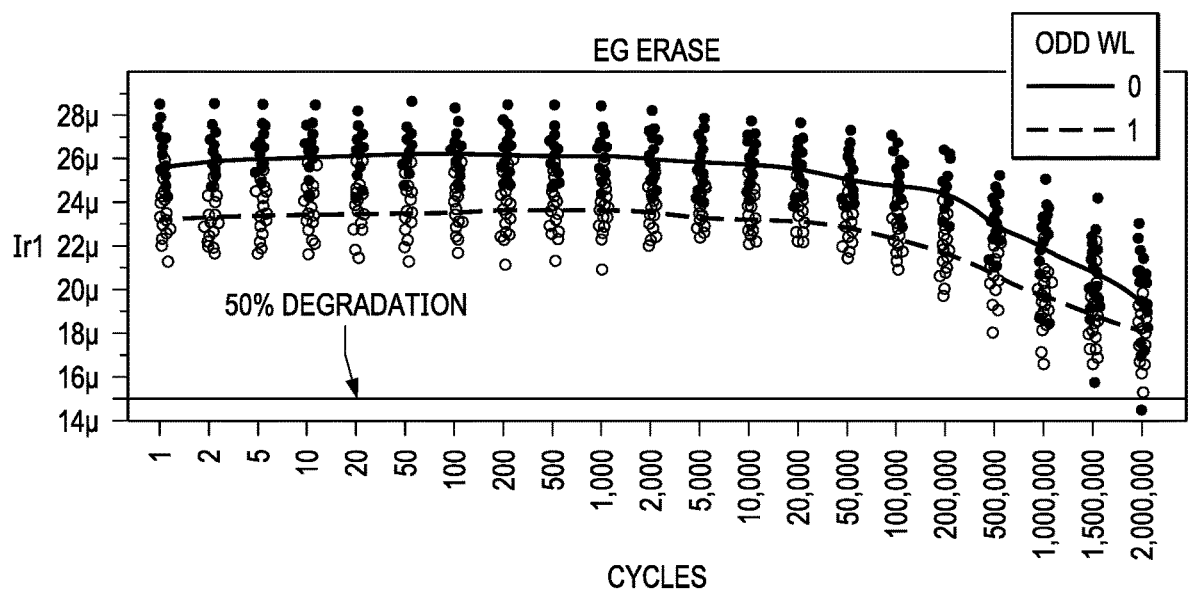
Figure 3C:
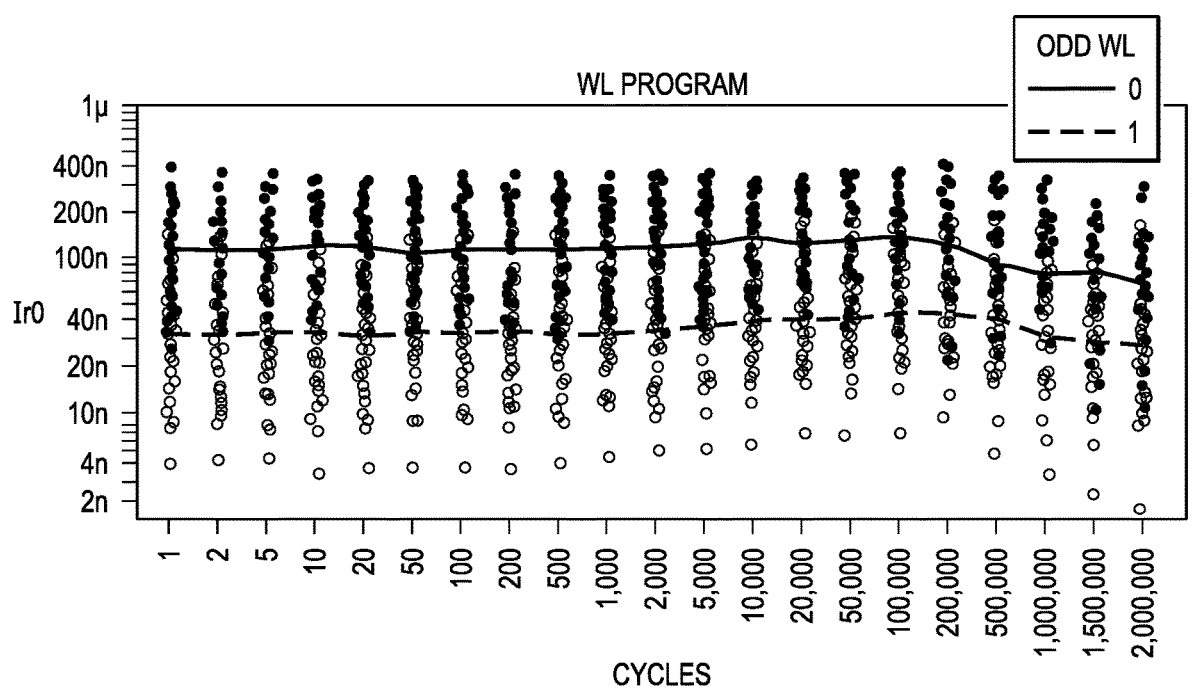
Figure 3D:
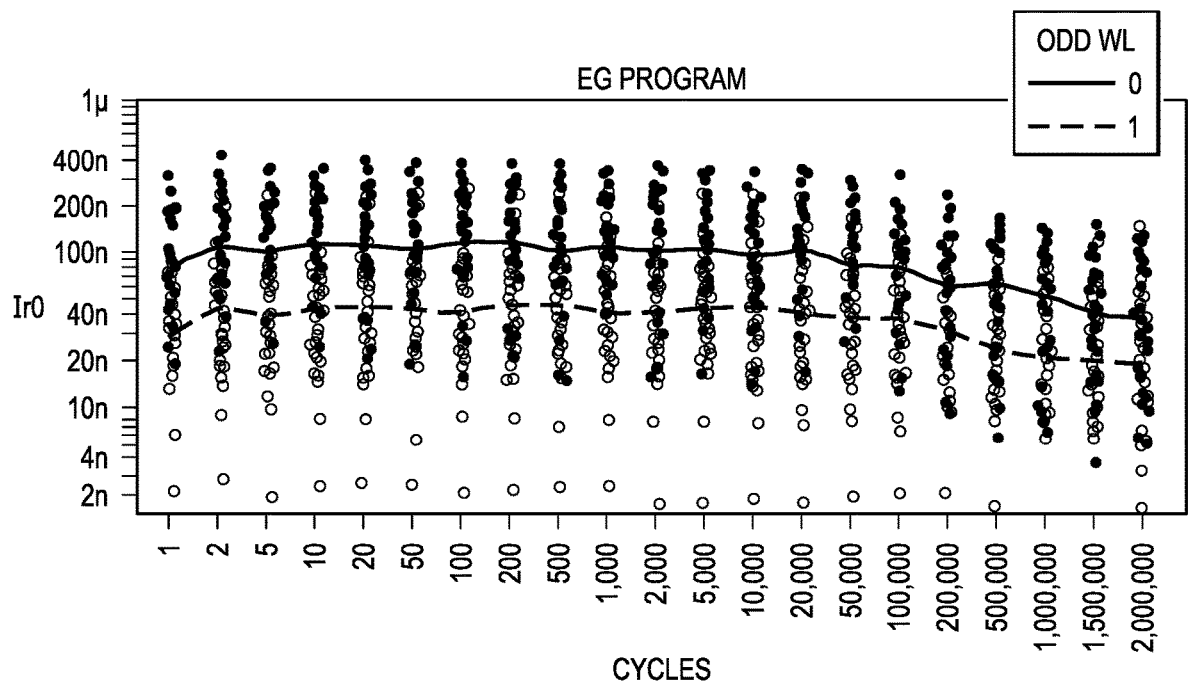

The inventors surprisingly discovered that performing erase functions through either the word line WL or the erase gate/coupling gate EG/CG over each floating gate FG results in a similar degradation of the cell erase performance over time, as illustrated by the example test results shown in FIGS. 3A-3D for an example flash memory cell of the type shown in FIG. 2. FIG. 3A shows example erase current (Ir1) data for erase functions performed via the word line, while FIG. 3B shows example erase current (Ir1) data for erase functions performed via the erase/coupling gate. The two data sets (two lines) in each figure correspond with the two floating gates in the cell. FIG. 3C shows example program current (Ir0) data for program functions performed via the word line, while FIG. 3D shows example program current (Ir0) data for program functions performed via the erase/coupling gate. Again, the two data sets (two lines) in each plot correspond with the two floating gates in the cell.

As shown in the erase data (FIGS. 3A-3B), the degradation of the erase current over time (as a function of program/erase cycles) is similar for erase functions performed via the word line (FIG. 3A) and erase functions performed via the erase/coupling gate (FIG. 3A). The inventors conceived the idea to selectively use both the word line and the erase/coupling gate for erase functions, in an alternating or switched manner, to thereby increase (e.g., double or substantially double) the useful life of the cell (as measured in cycles). Accordingly, with respect to the example flash memory cell shown in FIG. 2, an embodiment of the present invention involves selectively switching or alternating between the word line and the erase/coupling gate for performing erase functions at each floating gate.

Thus, some embodiments provide an electronic device (e.g., integrated circuit device) including one or more flash memory cells, and erase control electronics (e.g., circuitry) configured to alternate or switch between (a) performing erase functions through the erase/coupling gate and (b) performing erase functions through the word line for each floating gate of each flash cell. The erase control electronics may switch the erase node after each program/erase cycle, or after N cycles (where N is any number greater than 1), or based on a cumulative count of erase cycles performed via the EG/CG ("EG erase") versus the WL ("WL erase"), or based on a measured erase current after an EG erase or after a WL erase, or in any other manner or based on any other input data.

Figure 4:
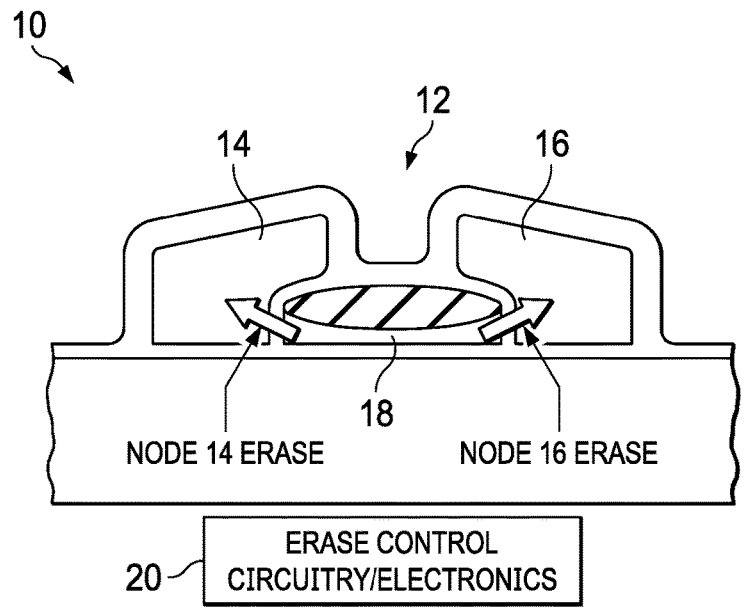
FIG. 4 illustrates an example device including a memory cell having two program/erase nodes formed over a floating gate, and erase control circuitry/electronics configured to selectively use the two program/erase nodes, in an alternating or switched manner, for cell erase functions.

FIG. 4 illustrates an example integrated circuit device 10 including (a) a memory cell structure 12 including (at least) a pair of program/erase nodes 14, 16 formed over a floating gate 18, and (b) erase control circuitry or electronics 20, according to example embodiments of the present invention. Each program/erase node 14 and 16 may comprise any type of node coupled to a floating gate 18 in a manner than allows erase functionality via the respective node 14, 16. Each program/erase node 14 and 16 may or may not also provide program functionality via the floating gate 18, depending on the particular embodiment. In some embodiments, memory cell structure 12 represents only a portion of a larger memory cell. For example, memory cell structure 12 may represent only the left half of the flash memory cell shown in FIG. 2, where node 14 represents the left-side word line WL and node 16 represents the coupling gate EG/CG extending over both floating gates 18.

Erase control electronics (e.g., circuitry) 20 may be configured to selectively switch between the program/erase nodes 14 and 16 for performing erase functions in the memory cell. For example, control electronics may switch or alternate between the pair of program/erase nodes to perform erase functions in the memory cell. For example, erase control electronics 20 may switch back and forth between program/erase nodes 14, 16 after each successive erase function.

As another example, erase control electronics 20 may switch between program/erase nodes 14, 16 after every N erase functions, wherein N is greater than 1, e.g., where N is at least 10 (e.g., between 10 and 100), at least 100 (e.g., between 100 and 1,000), at least 1,000 (e.g., between 1,000 and 10,000), at least 10,000 (e.g., between 10,000 and 100,000), at least 100,000 (e.g., between 100,000 and 1,000,000), or at least 1,000,000 (e.g., between 1,000,000 and 2,000,000). In such embodiments, erase control electronics 20 may be configured to maintain a count of erase functions performed using each program/erase node 14, 16, and switch between the program/erase nodes 14, 16 for performing erase functions based at least on the current count of erase functions, e.g., when the count of consecutive erase functions via a particular node 14, 16 exceeds N.

As another example, erase control electronics 20 may be configured to switch between program/erase nodes 14, 16 as a function of an actual erase current of the memory cell. Thus, in one embodiments, erase control electronics 20 may include circuitry for measuring an erase current of the respective memory cell, and switching between the program/erase nodes 14, 16 based at least on the measured erase current, e.g., when the measured erase current meets or crosses a defined threshold value. In another embodiment, erase control electronics 20 may include circuitry for comparing the erase current of the respective memory cell with a reference current value (e.g., a pre-set current value stored in a reserved memory bit), without performing an active measurement of the erase current, and triggering a switch between the program/erase nodes 14, 16 based at least on the comparison.

Erase control electronics 20 may include any suitable circuitry, hardware, and/or logic instructions for providing any of the functionality disclosed herein. For example, erase control electronics 20 may include charge pumps and high voltage decoders for pulse generation, and latches, flip flops, or shift registers for storing the cycle count/position. In some embodiments, erase control electronics 20 may include comparators to compare the stored cycle count with an on-chip reference value, and determine when to switch the erase node. For example, the circuitry may trigger an erase node switch when the stored cycle count is greater than an on-chip reference value N, and reset the store cycle count back to 1. Alternatively, erase control electronics 20 may use binary memory to alternate after each successive erase, where a value of 0 may represent erasing via node 14, and a value of 1 may represent erasing via node 16, where the memory switches from 0 to 1, or from 1 to 0 after each cycle. In an example embodiment in which the erase node is switched based on the actual (measured or otherwise) erase current of the cell, erase control electronics 20 may set a reserved reference bit to a specific current value, e.g., 15 uA, and compare the cell erase current to this reference current value to determine whether to trigger an erase node switch, e.g., when the cell erase current drops below the reference current value.

Figure 5:
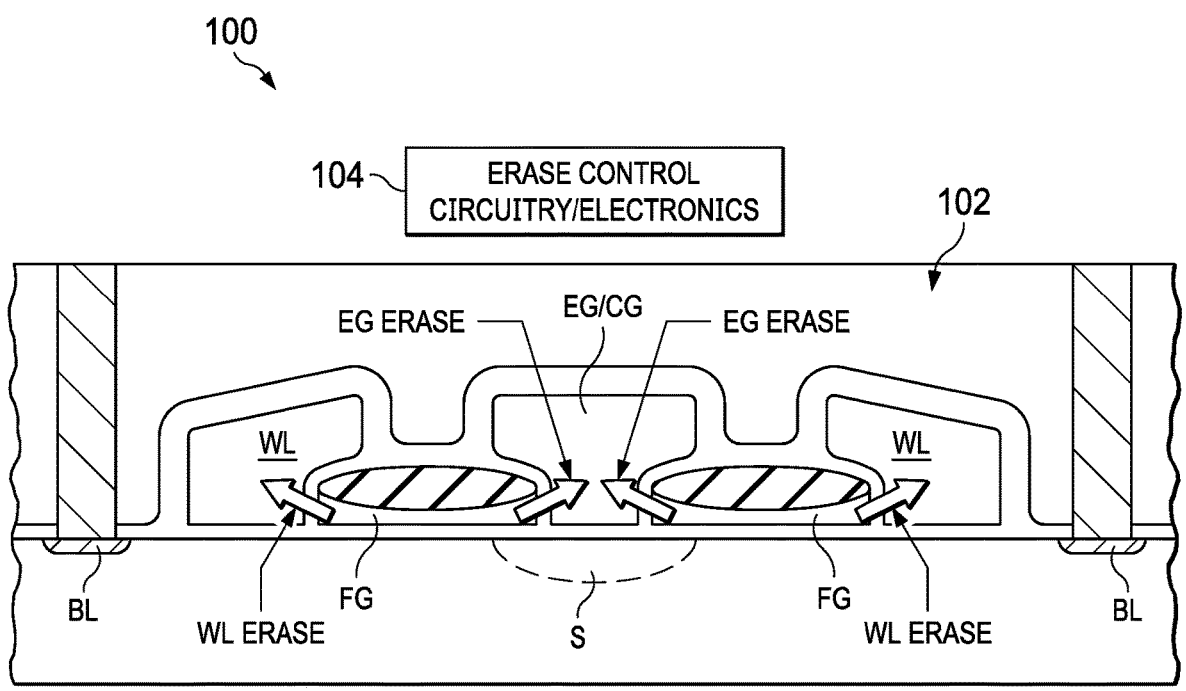
FIG. 5 illustrates an example device including a flash memory cell having a pair of floating gates and a word line and a shared "coupling gate" over each floating gate, and erase control circuitry/electronics configured to selectively use the word line and coupling gate over each floating gate, in an alternating or switched manner, for erase functions.

FIG. 5 illustrates an example integrated circuit device 100 including a flash memory cell 102 having the structure shown in FIG. 2, and erase control circuitry or electronics 104, according to one embodiment of the invention. Flash memory cell 102 may include a pair of floating gates FG, a word line WL over each floating gate FG, and a shared erase gate/coupling gate EG/CG formed between and extending over the pair of floating gates.

Erase control circuitry electronics 104 may be configured to selectively switch between the WL and EG/CG over each floating gate for performing erase functions via the respective floating gate, e.g., using any of the switching techniques disclosed herein (e.g., in an alternating manner, after each N erase cycles, based on a measured erase current, etc.). Erase control circuitry electronics 104 may include any suitable circuitry, hardware, and/or logic instructions for providing such switching functionality, e.g., including any of the elements discussed above regarding erase control electronics 20 shown in FIG. 4.

In one example embodiment, device 100 may be configured to apply the following cell voltages for performing a WL erase for "+" cell operation and for performing an EG erase for "EG" cell operation:

WL erase ("+" cell operation); WL=10V, CG=−5V
EG erase ("EG" cell operation); EG=10V, WL=−5V The initial erased cell currents (Ir1) may be identical. In some embodiments, device 100 may selectively favor "+" or "EG" cell operation, e.g., due to reduced voltage requirements resulting from cell scaling.

Figures 6, 8:
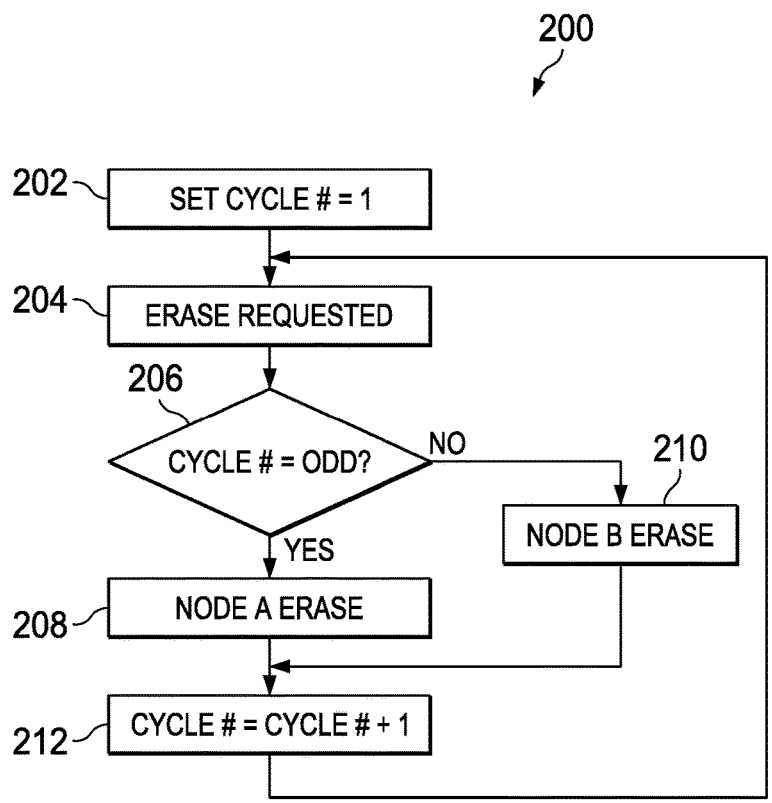
FIG. 6 illustrates an example method for selectively using two program/erase nodes for cell erase functions, by alternating between the two program/erase nodes after each program/erase cycle, according to an example embodiment.
FIG. 8 illustrates an example voltage truth table for operating a memory cell according to the present invention, including example voltages for selectively performing erase functions via two program/erase nodes.

FIG. 6 illustrates an example algorithm 200 for selectively using two program/erase nodes (e.g., a word line and a erase/coupling gate) for cell erase functions, by alternating between the two program/erase nodes after each program/erase cycle, according to an example embodiment. Algorithm 200 may be executed or implemented by device 10 or device 100, for example, and more particularly, by erase control electronics 20 or 104.

At 202, erase control electronics 20 or 104 may set a cycle number counter to 1. At 204, a cell erase function is requested by the device. At 206, erase control electronics 20 or 104 may determine whether the cycle counter value is odd. Depending on the result, erase control electronics 20 or 104 may effect a Node A erase (e.g., WL erase) at 208 or a Node B erase (e.g., EG erase) at 210. Erase control electronics 20 or 104 may then increase the cycle counter value by one, and await the next erase request.

Figure 7:
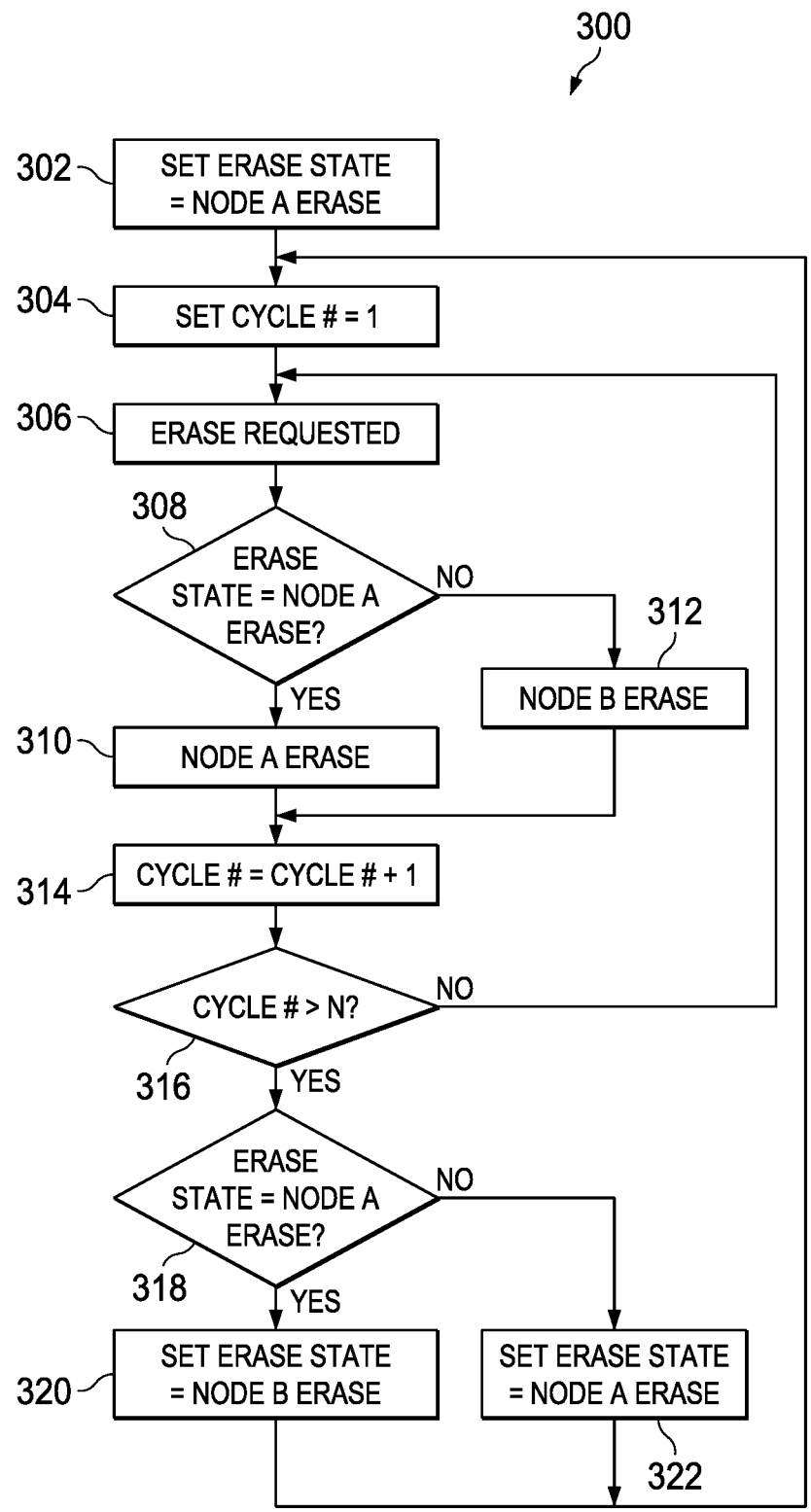
FIG. 7 illustrates an example method for selectively using two program/erase nodes for cell erase functions, by switching between the two program/erase nodes after every N program/erase cycles, where N>1, according to an example embodiment.

FIG. 7 illustrates an example method for selectively using two program/erase nodes (e.g., a word line and a erase/coupling gate) for cell erase functions, by switching between the two program/erase nodes after every N program/erase cycles, where N>1, according to an example embodiment. Algorithm 300 may be executed or implemented by device 10 or device 100, for example, and more particularly, by erase control electronics 20 or 104.

At 302, erase control electronics 20 or 104 may set an erase state to "Node A erase." At 304, erase control electronics 20 or 104 may set a cycle number counter to 1. At 306, a cell erase function is requested by the device. At 308, erase control electronics 20 or 104 may determine whether the erase state is currently set to "Node A erase" (as opposed to "Node B erase). Depending on the result, erase control electronics 20 or 104 may effect a Node A erase (e.g., WL erase) at 310 or a Node B erase (e.g., EG erase) at 312. Erase control electronics 20 or 104 may then increase the cycle counter value by one at 314.

Erase control electronics 20 or 104 may then compare the cycle counter value to a define threshold value N. N may be any suitable value greater than 1, e.g., as discussed above with respect to FIG. 4. If the cycle counter value does not exceed N, the device maintains the current erase state ("Node A erase" or "Node B erase") and awaits the nest erase request at 306. Alternatively, if the cycle counter value does exceed N, erase control electronics 20 or 104 switches the erase state at 318-322. At 318, erase control electronics 20 or 104 determines the current erase state, and based on the result, switches to the other erase state at 320 or 322. Erase control electronics 20 or 104 may then reset the erase cycle counter to one at 304, and await the next erase request.

FIG. 8 illustrates an example voltage truth table 400 that may be implemented by device 100 shown in FIG. 5 for operating the example memory cell 102, including example voltages for selectively performing WL erase and EG erase, according to one example embodiment.

The invention claimed is:

1. A method, comprising:
  providing a memory cell including a floating gate and a pair of program/erase nodes over the floating gate; and
  selectively alternate between the pair of program/erase nodes after every N erase functions, wherein N is greater than 1, to perform a series of erase functions in the memory cell.

2. The method of claim 1, wherein N is at least 10, at least 100, at least 1,000, at least 10,000, or at least 1,000,000.

3. The method of claim 1, wherein the memory cell comprises a flash memory cell.

4. The method of claim 1, wherein the pair of program/erase nodes comprise an erase gate and a word line.

5. The method of claim 1, wherein the pair of program/erase nodes comprise a coupling gate and a word line.

6. An electronic device, comprising:
   a memory cell including a floating gate and a pair of program/erase nodes over the floating gate; and
   erase control electronics configured to:
      measure an erase current of the memory cell; and
      selectively switch between the pair of program/erase nodes based at least on the measured erase current to perform a series of erase functions in the memory cell.

7. The electronic device of claim 6, wherein the pair of program/erase nodes comprise an erase gate and a word line.

8. The electronic device of claim 6, wherein the pair of program/erase nodes comprise a coupling gate and a word line.

9. The electronic device of claim 6, wherein the memory cell comprises a flash memory cell.

* * * * *